United States Patent [19]
Krone-Schmidt et al.

[11] Patent Number: 5,409,418
[45] Date of Patent: Apr. 25, 1995

[54] ELECTROSTATIC DISCHARGE CONTROL DURING JET SPRAY

[75] Inventors: Wilfried Krone-Schmidt, Fullerton; Edward S. Di Milia; Michael J. Slattery, both of Gardena, all of Calif.

[73] Assignee: Hughes Aircraft Company, Los Angeles, Calif.

[21] Appl. No.: 952,126

[22] Filed: Sep. 28, 1992

[51] Int. Cl.⁶ .............................................. B24C 1/00
[52] U.S. Cl. ........................................ 451/75; 451/78; 451/39; 451/102
[58] Field of Search ................. 51/413, 319, 320, 439, 51/410; 451/78, 38, 39, 102, 75

[56] References Cited

U.S. PATENT DOCUMENTS

| | | | |
|---|---|---|---|
| 3,600,632 | 8/1971 | Bright et al. | 317/2 |
| 4,132,567 | 1/1979 | Blackwood | 134/1 |
| 4,228,479 | 10/1980 | Larigaldie et al. | 361/218 |
| 4,417,293 | 11/1983 | Larigaldie | 361/212 |
| 4,535,576 | 8/1985 | Shukla et al. | 51/413 |
| 4,677,704 | 7/1987 | Huggins | 15/1.5 R |
| 4,806,171 | 2/1988 | Whitlock et al. | 134/7 |
| 4,832,753 | 5/1989 | Cherry et al. | 134/22.18 |
| 4,936,922 | 6/1990 | Cherry | 134/22.18 |
| 4,962,891 | 10/1990 | Layden | 239/597 |

FOREIGN PATENT DOCUMENTS 0288263 10/1988 European Pat. Off.
8605962 10/1986 WIPO.

OTHER PUBLICATIONS

R. C. Loveridge, "C02 Jet Spray Cleaning of IR Thin Film Coated Optics," SPIE 36th International Symposium on Optical and Optoelectric Applied Science & Engineering, Jul. 21–26, 1991, San Diego, Calif.

S. A. Hoenig, "The Application of Dry Ice to the Removal of Particulates from Optical Apparatus, Spacecraft, Semiconductor Wafers, and Equipment Used in Contaminant Free Manufacturing Processes", Sep. 1985.

Patent Abstracts of Japan vol. 9, No. 115 (E-315) (Abstract) Jan. 1985.

*Primary Examiner*—Robert A. Rose
*Attorney, Agent, or Firm*—M. E. Lachman; M. W. Sales; W. K. Denson-Low

[57] ABSTRACT

An improved apparatus and method adapted for use in removing trace contaminants from the surface of a chosen substrate, such as delicate surfaces or precision parts, by application of a stream or jet spray of expanded fluid to the substrate surface. The improvement consists of controlling electrostatic charges generated on or near the substrate surface during the cleaning process.

5 Claims, 1 Drawing Sheet

ELECTROSTATIC DISCHARGE CONTROL DURING JET SPRAY

BACKGROUND OF THE INVENTION

1. Field of the Invention

The present invention relates generally to apparatus and methods used to remove contaminants from the surface of a chosen substrate by application of a stream or jet spray of expanded fluid to the substrate surface. Such apparatus and methods are typically used to remove trace contaminants from delicate surfaces or precision hardware found in high sensitivity optical, electronic and precision mechanical equipment. More particularly, the present invention relates to an improved jet spray system which controls electrostatic charges that may be generated on or near the substrate surface.

2. Description of Related Art

It is essential that the delicate and precision surfaces of optical-mechanical-electronic equipment be contaminant-free. For example, infrared optical sensor systems use thin film optical coatings to enhance in-band transmittance and reject out-of-band radiation. Even trace amounts of contamination degrade spectral performance by scattering, absorbing, or reflecting incident radiation.

The particulate and molecular contaminants present on optical surfaces can cause problems by changing emittance characteristics thereby increasing thermal noise in optical devices. Dust and debris contamination present on a detector surface may also generate clutter and the appearance of false targets. Further, the presence of molecular contaminants on precision optical equipment surfaces, such as lenses, windows and optical filters, results in the absorption and scatter of incident energy with the resultant decrease in system quality.

In precision computer and gyroscope equipment, particulate contamination in a moving disk drive or in a spinning gyroscope stator may damage or disable such a system beyond repair. Technologies used in manufacturing integrated circuits similarly require substrates be free of particulate and molecular contaminants.

A wide variety of cleaning solvents and solutions, such as chlorofluorocarbons and ketones, have been utilized to clean delicate surfaces. However, the majority of these cleaning solutions and solvents are environmentally hazardous. In response to these environmental concerns, a number of environmentally safe cleaning mediums have been proposed. One particular cleaning medium which has been investigated is carbon dioxide. A variety of investigators have reported cleaning various parts utilizing a stream or jet spray of carbon dioxide. The jet stream of carbon dioxide, also known as "dry ice snow", has been used to remove light oils and particulate contaminants from surfaces. Such carbon dioxide jet sprays have been used to clean contaminants from a variety of surfaces including silicon wafers, telescope mirrors and thin film optical coatings.

Since the carbon dioxide snow is very cold, around minus 60 degrees centigrade at ambient pressure, prolonged spray will cool the substrate surface causing a build up of condensation on the substrate after application of the stream or spray of carbon dioxide snow to the substrate is discontinued. A variety of investigators have used a dry nitrogen gas purge to eliminate condensation of moisture on the substrate surface. The dry nitrogen gas can be applied to the substrate surface before, during and after completion of the cleaning process to prevent the build up of condensation.

The formation and use of carbon dioxide snow streams is disclosed in the following articles, the contents of which are hereby incorporated by reference: S. A. Hoening, "Cleaning Surfaces With Dry Ice", Compressed Air Magazine, August 1986; R. V. Peterson, C. W. Bowers, "Contamination Removal By $CO_2$ Jet Spray," SPIE, Volume 1329, Optical System Contamination, Effects, Measurements, Control II, 1990; L. Layden, D. Wadlow, "High Velocity Carbon Dioxide Snow For Cleaning Vacuum System Surfaces," Journal of Vacuum Science Technology, A8 (5), September/October 1990; R. Sherman, W. H. Whitlock, "The Removal of Hydrocarbons and Silicon Grease Stains From Silicon Wafers," Journal of Vacuum Science Technology, B8 (3) May/June 1990; R. Zito, "Cleaning Large Optics With $CO_2$ Snow," SPIE, Volume 1236, Advanced Technology Optical Telescopes IV, 1990.

The use of carbon dioxide snow to clean delicate surfaces has proven to be very useful. However, as with any new cleaning system, there is a continual need to further develop and improve upon existing systems and procedures.

SUMMARY OF THE INVENTION

In accordance with the present invention, an improved apparatus and method are provided for removing contaminants from the surface of a chosen substrate by application of a stream or jet spray of expanded fluid to the substrate surface wherein the improvement consists of controlling electrostatic charges generated on or near the surface during the cleaning process.

The present invention is based on the discovery that the application of a stream or jet spray of carbon dioxide snow to a delicate substrate can produce undesirable electrostatic charges on or near the substrate surface. More specifically, the impingement of a stream or jet spray of carbon dioxide snow on a substrate surface can produce a series of undesirable electrostatic discharges ("ESD") on or near the substrate surface which can damage a delicate substrate. The impingement of a stream or jet spray of carbon dioxide snow on a substrate can also cause the substrate surface to become electrostatically charged. This is disadvantageous because an electrostatically charged substrate will attract airborne particulates, or destroy ESD sensitive components.

The present invention is based on the further discovery that these undesirable electrostatic charges can be eliminated by ionizing the cleaning snow prior to application of the cleaning snow to the chosen substrate or, alternatively, by producing a stream of dry gas which substantially surrounds the cleaning snow during the cleaning process and ionizing the stream of dry gas during the cleaning process or, alternatively, by introducing a radioactive stream of ionizing particles into the stream of cleaning snow or into the stream of dry gas or by otherwise directing a radioactive stream of ionizing particles towards the substrate surface during the cleaning process.

In accordance with the present invention, the improved apparatus, as adapted for use in removing contaminants from a chosen substrate by application of a stream of expanded fluid to the substrate surface, includes a jet spray device for producing a stream of expanded fluid and directing the stream of expanded fluid to the chosen substrate. The jet spray device comprises a valve assembly and a nozzle. The valve assembly includes a valve stem and valve seat which together form a critical orifice through which a compressed fluid is expanded into a stream of expanded fluid. The valve assembly also includes a housing with an inlet for receiving the compressed fluid from a source of compressed fluid and an exit port for transmitting the expanded fluid to the nozzle. The nozzle has an intake port for receiving the expanded fluid from the exit port of the valve assembly and a nozzle throat and nozzle outlet for shaping and directing the stream of expanded fluid toward the substrate surface.

As an additional feature of the present invention, the improved apparatus includes a plastic sleeve, which is concentrically positioned over the jet spray device. The inner wall of the sleeve is complementary contoured to the outer surface of the nozzle. The sleeve has an intake manifold for receiving an expanded supplemental fluid from a compressed supplemental fluid reservoir. The sleeve has dimensions such that the sleeve, when in assembled relation with the spray device, defines a supplemental fluid cavity which is of sufficient size to produce a stream of expanded supplemental fluid and to enable the stream of expanded supplemental fluid to flow forwardly through the supplemental fluid cavity toward the substrate. The rearward end of the sleeve is connected to the housing of the valve assembly. The forward end of the sleeve extends sufficiently forward beyond the nozzle outlet to ensure that the stream of expanded supplemental fluid surrounds the stream of expanded fluid during the cleaning process.

As an additional feature of the present invention, the sleeve includes a relief located on the inner wall near the forward-most portion of the sleeve. The relief defines a concentric channel on the sleeve inner wall for receiving a grounding ring which is complementary contoured to the shape of the relief. The grounding ring, when in assembled relation with the relief, fills the concentric channel defined by the relief. The grounding ring is connectable to an electric ground.

As yet another feature of the present invention, tungsten electrodes are positioned in the stream of supplemental fluid forward of the intake manifold and rearward of the grounding ring. The electrodes are connectable in parallel to an external source of power capable of providing 5000 volts to the electrodes. To avoid shock hazard, a 100 megaohm resistor is connectable in series between the power supply and the electrodes thereby reducing the current to the apparatus to microamperes. The difference in potential between the electrodes and the grounding ring is sufficient to generate an electric field of sufficient intensity to ionize the stream of expanded supplemental fluid.

As an additional feature of the present invention, the electrodes are configured such that the length of each electrode is substantially greater than its width. This configuration produces a non-linear voltage gradient whereby ionization of the expanded supplemental fluid is enhanced.

As yet another feature of the present invention, the improved apparatus and method further include the use of a single source of compressed fluid as the source of the expanded fluid and the source of expanded supplemental fluid.

As an alternative feature of the present invention, the improved apparatus and method include, as a means for ionizing the stream of expanded fluid, a first conductive surface located directly in the stream of expanded fluid forward of the nozzle outlet and rearward of the substrate, and a second conductive surface, located directly in the stream of expanded fluid between the first conductive surface and the substrate. The first conductive surface is connectable to a first source of electric potential and the second conductive surface is connectable to a second source of electric potential. The first source of electric potential is sufficiently different from the second source of electric potential to generate an electric field of sufficient intensity to ionize the stream of expanded fluid. To avoid shock hazard, resistors are used to reduce the current to the apparatus to microamperes.

As an additional aspect of the above-described alternative feature, the first and second conductive surfaces are configured to generate a non-linear voltage gradient whereby ionization of the stream of expanded fluid is enhanced.

As yet another aspect of the above-described alternative feature, the direction of current across the first and second conductive surfaces is alternated cyclically by application of a direct current pulsing power supply across the first and second conductive surfaces.

As an alternative feature of the present invention, the improved apparatus and method include, as an electrostatic control means, a means of introducing a radioactive stream of ionizing particles, such as alpha-emitters, into the stream of expanded fluid or into the stream of expanded supplemental fluid or otherwise directing a radioactive stream of ionizing particles towards the substrate surface during the cleaning process.

In accordance with the present invention, a method for removing contaminants from a chosen substrate is provided which includes the step of directing a stream of expanded fluid toward the substrate surface and the additional step of controlling the electrostatic charges generated upon application of the stream of expanded fluid to the substrate surface.

The above features and many other features and attendant advantages of the present invention will become better understood by reference to the following detailed description when taken in conjunction with the accompanying drawings.

DESCRIPTION OF PREFERRED EMBODIMENTS

The following detailed description will be directed to an apparatus and method adapted for use in removing contaminants from thin film optical surfaces and the surfaces of sensitive electronic hardware by application of a stream of carbon dioxide snow to the substrate surface. However, it will be understood by those skilled in the art that the present invention has much wider application and may be used to clean a wide variety of delicate or precision surfaces as well as any other surfaces or structures wherein the impingement of a chosen cleaning medium upon a chosen substrate generates electrostatic charges on or near the substrate surface. It will be further understood by those skilled in the art that the present invention does not require that the carbon dioxide snow be used as the cleaning medium.

Rather, the present invention relates to the use of any cleaning medium which, upon impingement on the chosen substrate, generates electrostatic charges on or near the substrate, including but not limited to the group of supercritical fluids which include nitrogen, argon, and neon. The term "supercritical fluid" is used herein to mean any fluid which has liquid-like densities when pressurized above its supercritical pressure and heated above its supercritical temperature. The term "fluid" as used herein means any substance or composition of substances comprising liquid, gas or solid particulates or any combination thereof.

It also will be understood by those skilled in the art that the present invention provides a means of controlling both desirable and undesirable electrostatic charges generated on or near a substrate upon impingement of a chosen cleaning medium on the chosen substrate and that the present invention can be used to impart or reduce said electrostatic charges.

Figure 1:
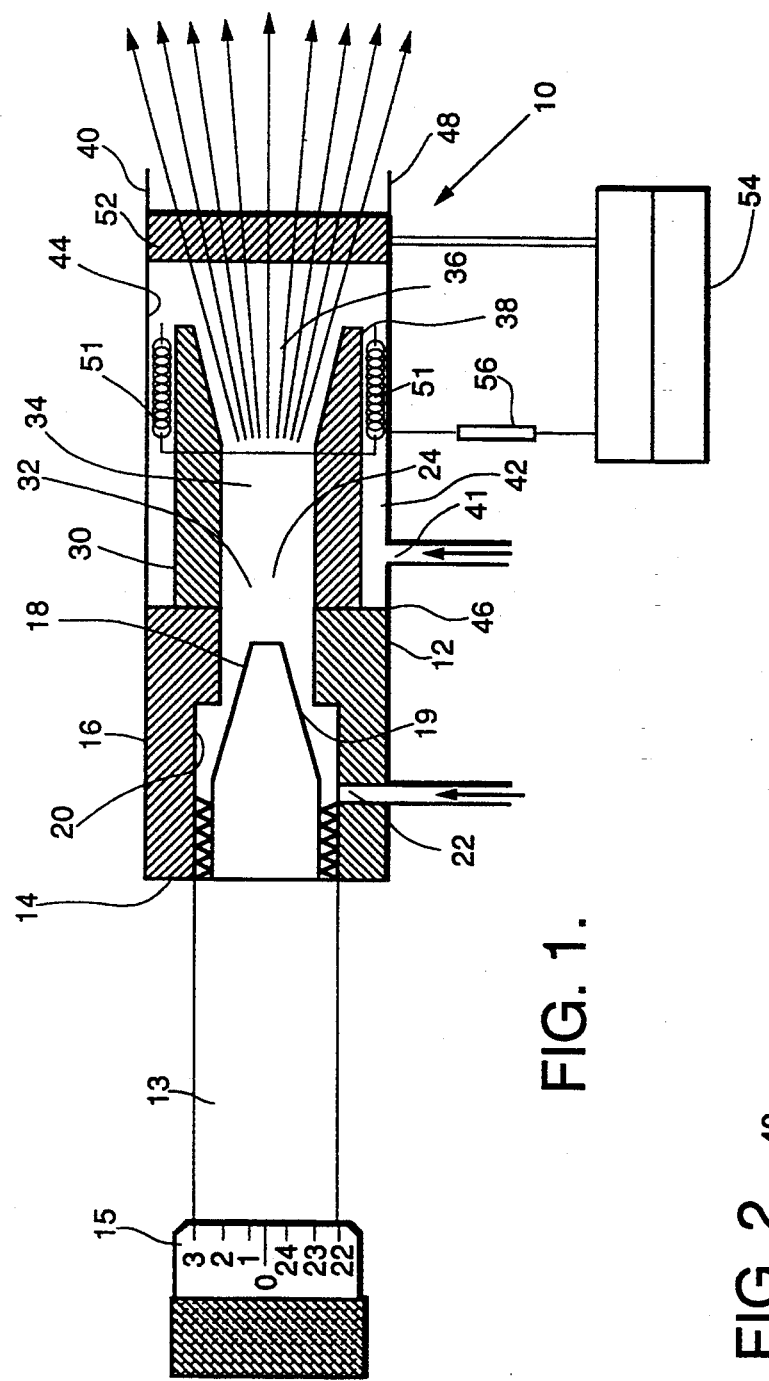
FIG. 1 is a partial schematic representation of a preferred exemplary apparatus in accordance with the present invention.

A preferred exemplary apparatus is shown generally at 10 in FIG. 1. The apparatus 10 includes jet spray device 12, which includes valve assembly 14 and nozzle 30 which is attached to valve assembly 14. Valve assembly 14 includes housing 16, valve stem 18, and valve seat 20. Housing 16 includes inlet 22 for receiving liquid carbon dioxide (a preferred "compressed fluid" for precision cleaning applications) from an ultra-pure carbon dioxide source (not shown) and exit port 24 for transmitting the carbon dioxide snow (a preferred "expanded fluid" for precision cleaning applications) to nozzle 30. Valve stem 18 is axially movable in relation to valve seat 20 to form critical orifice 19 which controls the rate of flow of the cleaning snow to nozzle 30. Vernier 15 is provided on handle 13 for accurate and repeatable setting of the orifice 19. Nozzle 30 includes intake port 32 for receiving the cleaning snow from exit port 24 and nozzle throat 34 and outlet 36 for shaping the stream of cleaning snow and directing the stream of cleaning snow to the substrate surface (not shown).

The length and internal diameter of nozzle 30 may vary widely, depending upon the surface to be cleaned, the degree of cleanliness desired and the cleaning medium to be applied to the chosen substrate. In precision cleaning applications utilizing carbon dioxide snow, the length of nozzle 30 preferably will be between about 20 millimeters(mm) to 500 millimeters in order to provide optimum directional control of the carbon dioxide snow streams without losing cleaning efficiency. Preferred internal diameters for such applications are from between 1 to 13 mm. In precision cleaning applications, valve 14 is preferably a conventional needle, metering, regulating, solenoid or other valve commonly used to provide precise metering of gaseous materials. Alternatively, nozzle 30 may include a critical orifice and valve assembly 14 is provided only as a means of introducing the compressed fluid into jet spray device 12.

Apparatus 10 as shown in FIG. 1 further includes a nonconductive sleeve 40, which is concentrically positioned over jet spray device 12. Sleeve 40 includes intake manifold 41 for receiving an expanded supplemental fluid, such as nitrogen, from a compressed supplemental fluid reservoir (not shown). Sleeve 40 has dimensions such that sleeve 40, when in assembled relation with jet spray device 12, defines supplemental fluid cavity 42 which is of sufficient size to produce a stream of expanded supplemental fluid and to enable the stream of expanded supplemental fluid to flow forwardly through supplemental fluid cavity 42 and surround the jet stream of cleaning snow as the cleaning snow flows from outlet 36 toward the chosen substrate.

In the preferred embodiment as shown in FIG. 1, rearward end 46 of sleeve 40 is attached to housing 16, and forward end 48 of sleeve 40 extends sufficiently forward beyond outlet 36 to ensure that the stream of expanded supplemental fluid surrounds the cleaning snow during the cleaning process. As best shown in FIG. 1, inner wall 44 of sleeve 40 is complementary contoured to outer surface 38 of nozzle 30 thus enabling the stream of expanded supplemental fluid to complementary contour to the stream of cleaning snow. Preferably, sleeve 40 is made from plastic or other material having non-conductive properties. Polytetrafluoroethylene is a preferred plastic material.

Figure 2:
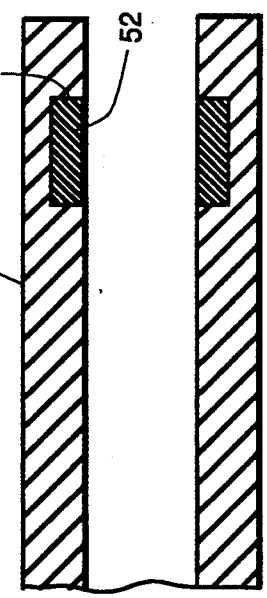
FIG. 2 is a partial sectional view of the embodiment shown in FIG. 1 showing the grounding ring and sleeve in assembled relation.

As best shown in FIG. 2, sleeve 40 includes relief 50 located on inner wall 44 near the forward-most portion of sleeve 40. Relief 50 defines a concentric channel on inner wall 44 for receiving grounding ring 52 which is attachable to relief 50. Grounding ring 52 is complementary contoured to the shape of relief 50 such that grounding ring 52, when in assembled relation with relief 50, fills the concentric channel defined by relief 50. Grounding ring 52 is connectable to electric ground 54.

Apparatus 10 as shown in FIG. 1 also includes electrodes 51 positioned in the stream of supplemental fluid forward of intake manifold 41 and rearward of grounding ring 52. Electrodes 51 are connectable in parallel to power supply 54. Alternatively, electrodes 51 are connected separately to power supply 54. This alternative arrangement allows electrodes 51 to be alternately charged by voltages from either an alternating current power supply or a pulsing direct current power supply. Electrodes 51 are configured to produce a non-linear voltage gradient whereby ionization of the expanded supplemental fluid is enhanced. Preferably, electrodes 51 are composed of a conductive material such as tungsten and are configured such that the length of electrodes 51 is substantially greater than the width of electrodes 51. Preferably, power supply 54 provides about 5000 volts to electrodes 51. To avoid shock hazard, a 100 megaohm resistor 56 is connected in series between power supply 54 and electrodes 51 thereby reducing the current to apparatus 10 to microamperes.

It should be understood that the dimensions of sleeve 40 will vary in accordance with the application and the size and shape of nozzle 30.

It should be further understood that the ionization of the stream of expanded supplemental fluid can be accomplished by impressing a source of electric potential across any first conductive surface, located in the stream of expanded supplemental fluid rearward of the substrate, and any second conductive surface, located in the stream of expanded supplemental fluid between the first conductive surface and the substrate. The source of electric potential need not produce 5000 volts but rather need only be sufficiently high to generate an electric field of sufficient intensity to ionize the stream of expanded supplemental fluid.

It will also be understood by those skilled in the art that ionization may be accomplished by introducing a radioactive stream of ionizing particles, such as alpha-emitters, into the stream of expanded fluid or into the stream of expanded supplemental fluid or by otherwise directing a radioactive stream of ionizing particles towards the substrate surface during the cleaning process.

Typically, in precision cleaning applications utilizing carbon dioxide snow, dry compressed nitrogen has been used as the source of the expanded supplemental fluid. However, it should be understood that any source of ionizable compressed fluid can be used as the source of the expanded supplemental fluid if condensation of moisture on the substrate is not a problem. It should be further understood that in cleaning applications wherein condensation of moisture on the substrate is a problem, any ultra-pure source of compressed supplemental fluid can be used as the source of the expanded supplemental fluid. In precision cleaning applications using a compressed supercritical fluid such as ultra-pure liquid carbon dioxide as the cleaning medium, it is preferred that the compressed supercritical fluid be utilized not only as the source of expanded supercritical fluid but also as the source of expanded supplemental fluid thereby obviating the need for separate reservoirs for the compressed supercritical fluid and the compressed supplemental fluid.

In an alternative preferred embodiment (not shown) of the present invention, the control of electrostatic charges on or near the substrate surface is accomplished by impressing a source of electric potential across a first conductive surface, located directly in the stream of cleaning snow forward of outlet 36 and rearward of the substrate, and a second conductive surface, located directly in the stream of cleaning snow between the first conductive surface and the substrate. In this alternate embodiment of the present invention, it is preferable that power supply 56 be a direct current pulsing power supply wherein the current across the first and second conductive surfaces alternates cyclically.

The temperature and pressure of the carbon dioxide entering jet spray device 12 from inlet 22 is controlled in accordance with well known prior teachings regarding the formation of carbon dioxide snow. The carbon dioxide is preferably maintained at pressures on the order of 850 pounds per square inch (58.6 bar) prior to entering the snow forming jet spray device 12.

The velocity and particle size of the cleaning snow may be varied depending upon the type of surface being cleaned and the amount of contaminants present. Preferably, the velocity will be adjusted to achieve maximum cleaning efficiency while causing minimal surface damage to the substrate. Stream velocities on the order of 0.5 meters per second to 10 meters per second are generally suitable for removing most common contaminants from thin film optical materials. The particle sizes of the carbon dioxide ice entrained in the snow stream also can be varied depending upon the surface to be cleaned and the contaminants to be removed. Snow size can be varied to clean off submicron particles. For most applications, particle sizes for the carbon dioxide snow will be on the order of 0.1 micron to 100 microns.

The size of contaminant particles and compounds which can be removed utilizing carbon dioxide snow are generally on the order of submicrons to hundreds of microns in diameter. Molecular film contaminants which can be removed by the present invention are generally on the order of a few angstroms to several microns thick. Contaminants which can be cleaned by the system include particulates such as beryllium, cadmium, arsenic, selenium, chromium and uranium and their oxides or salts which are many times present in optical or precision mechanical systems. Other toxic contaminants, including organic oils, inorganic dusts, and the like, are amenable to cleaning utilizing the present invention. The preferred apparatus is not designed to provide cleaning of very large amounts of contaminants from surfaces. Instead, the apparatus is intended for use as a final cleaning step to provide the ultra-clean surfaces (i.e. "precision cleaning") which are required in high precision optical and electronic equipment and precision hardware.

The apparatus and method of the present invention are well-suited for use in cleaning surfaces on parts which are designed for use at cryogenic temperatures. When cleaning such parts, nitrogen, argon or neon may be utilized in place of carbon dioxide. The use of carbon dioxide is preferred because of its relatively low cost in comparison to the other gases, especially neon, and the low cost of the equipment required to produce carbon dioxide snow from liquid carbon dioxide.

Having thus described exemplary embodiments of the present invention, it should be noted by those skilled in the art that the disclosures within are exemplary only and that various other alternatives, adaptations and modifications may be made within the scope of the present invention. Accordingly, the present invention is not limited to the specific embodiments as illustrated herein, but is only limited by the following claims.

What is claimed is:

1. An apparatus adapted for use in removing contaminants from the surface of a substrate by application of a stream of expanded fluid to said substrate surface wherein said application of said stream of expanded fluid to said substrate surface generates electrostatic charges on or near said substrate surface, the apparatus comprising:

a spray device comprising an inlet for receiving a compressed fluid from a source of compressed fluid, means for expanding said compressed fluid sufficiently to form a stream of expanded fluid and an outlet for shaping said stream of expanded fluid and directing said stream of expanded fluid toward said substrate surface to remove said contaminants from said surface; and electrostatic control means located at said outlet of said spray device for controlling said electrostatic charges generated during said application of said stream of expanded fluid to said substrate surface wherein said electrostatic control means comprises:

shielding means for substantially surrounding said stream of expanded fluid with a stream of expanded supplemental fluid during said application of said stream of expanded fluid to said substrate surface; and means for ionizing said stream of expanded supplemental fluid.

2. The apparatus of claim 1 wherein said means for ionizing said stream of expanded supplemental fluid further comprises:

a first conductive surface located in said stream of expanded supplemental fluid rearward of said substrate surface, said first conductive surface being connectable to a first source of electric potential;

a second conductive surface located in said stream of expanded supplemental fluid between said first conductive surface and said substrate surface wherein said second conductive surface is connectable to a second source of electric potential sufficiently different from said first source of potential to generate an electric field of sufficient intensity to ionize said stream of supplemental fluid.

3. The apparatus of claim 2 wherein said first conductive surface and said second conductive surface are configured to generate a non-linear voltage gradient.

4. The apparatus of claim 1 wherein said shielding means further comprises:

a non-conductive sleeve, mountable over said spray device, said sleeve having an intake manifold for receiving said expanded supplemental fluid from a source of compressed supplemental fluid, said sleeve having dimensions such that said sleeve, when in assembled relation with said spray device, defines a supplemental fluid cavity of sufficient size to produce said stream of expanded supplemental fluid and to enable said stream of expanded supplemental fluid to flow forwardly through said supplemental fluid cavity and surround said stream of expanded fluid as said stream of expanded fluid flows forwardly towards said substrate surface.

5. The apparatus of claim 1 wherein said electrostatic control means further comprises a means for introducing a radioactive stream of ionizing particles near said substrate surface.

* * * * *